US006664849B1

(12) United States Patent
Taura et al.

(10) Patent No.: US 6,664,849 B1
(45) Date of Patent: Dec. 16, 2003

(54) DIGITAL FM DEMODULATOR PERFORMING AMPLITUDE COMPENSATION

(75) Inventors: Kenichi Taura, Tokyo (JP); Masayuki Tsuji, Tokyo (JP); Masahiro Tsujishita, Tokyo (JP); Masayuki Ishida, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/614,680

(22) Filed: Jul. 12, 2000

(30) Foreign Application Priority Data

Jul. 12, 1999 (JP) .......................................... 11-197278

(51) Int. Cl.[7] ........................... H03D 3/00; H04L 27/08; H03K 9/06
(52) U.S. Cl. ....................... 329/315; 329/318; 329/319; 329/320; 329/321; 455/214; 455/232.1; 455/234.1; 375/322; 375/324; 375/317; 375/345
(58) Field of Search .................. 329/315, 318, 329/319, 320, 321; 455/553, 234.2, 214, 232.1, 234.1; 375/322, 324, 317, 345

(56) References Cited

U.S. PATENT DOCUMENTS

| 4,463,317 | A | * | 7/1984 | Kusakabe | |
| 4,525,675 | A | * | 6/1985 | Richmond et al. | |
| 5,446,761 | A | * | 8/1995 | Nag et al. | 375/317 |
| 5,614,862 | A | | 3/1997 | Sun | 329/341 |
| 5,668,749 | A | | 9/1997 | Corleto et al. | 708/490 |
| 5,822,704 | A | * | 10/1998 | Ishii | 455/553 |
| 5,828,238 | A | | 10/1998 | Bailleul et al. | 329/303 |
| 5,883,548 | A | | 3/1999 | Assard et al. | 329/306 |
| 5,940,451 | A | * | 8/1999 | Kim | 375/345 |
| 6,121,829 | A | * | 9/2000 | Tokura | 329/341 |

FOREIGN PATENT DOCUMENTS

| JP | 61-140205 A | 6/1986 |
| JP | 5-175733 A | 7/1993 |
| JP | 8-307157 A | 11/1996 |
| JP | 9-130148 A | 5/1997 |
| JP | 9-186616 A | 7/1997 |

OTHER PUBLICATIONS

Kobayashi; Transactions of the Institute of Electronics, Information, and Communication Engineers of Japan; vol. J65–B No. 7; Jul. 1982; pp. 890–897.
Shoji Kondo et al: "Significant Digit Requirement for FM Demodulation Using Digital Signal Processing" Electronics & Communications in Japan, Part I –Communications, Scripta Technica, New York, US, vol. 73, No. 2, part 1, Feb. 1, 1990, pp. 21–29.

* cited by examiner

*Primary Examiner*—Arnold Kinkead
(74) *Attorney, Agent, or Firm*—Birch, Stewart, Kolasch & Birch, LLP (57) ABSTRACT

A digital FM demodulator converts a digital FM input signal to a demodulated signal, detects the amplitude of the digital FM input signal, generates a corresponding amplitude signal, and adjusts the amplitude of the demodulated signal according to the amplitude signal, thereby compensating for variations in the amplitude of the digital FM input signal and removing amplitude distortion from the demodulated signal. This reduces the performance requirements of, for example, a low-pass analog filter preceding the digital FM demodulator in an FM radio broadcast receiver, permitting the analog filter to be implemented in a semiconductor integrated circuit.

17 Claims, 9 Drawing Sheets

DIGITAL FM DEMODULATOR PERFORMING AMPLITUDE COMPENSATION

BACKGROUND OF THE INVENTION

The present invention relates to a demodulator that demodulates a frequency-modulated radio broadcast signal by digital signal processing.

Frequency-modulated (FM) radio broadcast receivers have traditionally employed analog demodulator circuits, typically comprising a limiter and a quadrature detector. With the increasing miniaturization of digital integrated circuits, however, it has become advantageous to employ digital FM demodulator circuits, especially in receivers that also receive digital broadcast signals.

In an FM radio broadcast receiver with a digital FM demodulator, the radio-frequency (RF) signal received at the antenna is down-shifted to an intermediate frequency (IF), then passed through an IF limiting amplifier that outputs a constant-amplitude IF signal. The constant-amplitude IF signal is converted to a digital signal, demodulated, then converted back to an analog signal for output to a loudspeaker.

Since the IF limiting process introduces unwanted harmonic components into the IF signal, the output of the IF limiting amplifier is passed through a low-pass pre-filter to reject the harmonics before analog-to-digital conversion. The pre-filter must combine ample attenuation of the harmonic components with an extremely flat passband characteristic, with substantially no ripple, to avoid re-introducing amplitude variations into the IF signal. It is difficult to satisfy both of these requirements in a filter of the type that can be realized in a semiconductor integrated circuit. If the pre-filter is disposed in a semiconductor integrated circuit, which is necessary for miniaturization of the receiver circuitry, amplitude variations cannot be avoided, but these amplitude variations distort the demodulated signal.

A further discussion of this problem will be given in the detailed description of the invention.

SUMMARY OF THE INVENTION

An object of the present invention is to provide a digital FM demodulator that compensates for unwanted amplitude variations generated in receiver components preceding the demodulator, thereby relaxing the performance requirements of these components.

The invented digital FM demodulator has means for performing the following processes:

converting a digital FM input signal to a demodulated signal;

detecting the amplitude of the digital FM input signal and generating a corresponding amplitude signal; and adjusting the amplitude of the demodulated signal according to the amplitude signal, thereby compensating for variations in the amplitude of the digital FM input signal.

Since the digital FM demodulator compensates for amplitude variations, receiver components that process the FM signal before input to the digital FM demodulator can be permitted to generate amplitude variations that could not be tolerated with a conventional digital FM demodulator.

The means for converting the digital FM input signal to a demodulated signal may operate by delaying the digital FM input signal and multiplying the digital FM input signal by the delayed signal. The demodulated signal can be obtained by comparatively simple processing in this way.

The amplitude signal can be obtained by taking the sum of the squares of the digital FM input signal and the delayed signal. The amplitude signal can be calculated efficiently in this way.

The means for adjusting the amplitude of the demodulated signal may use a polynomial approximation to calculate the reciprocal of the amplitude signal. The reciprocal can thus be calculated by comparatively simple processing.

The demodulated signal and amplitude signal may be decimated before the amplitude of the demodulated signal is adjusted. The necessary amount of adjustment processing is thereby reduced.

The invented digital FM demodulator may also have means for multiplying the digital FM input signal by a coefficient to reduce amplitude variations before demodulation is performed. The necessary adjustments to the amplitude of the demodulated signal can then be confined to a comparatively small range, facilitating the computations performed in the adjustment process.

The invented digital FM demodulator may also have means for applying an arcsine correction to the demodulated signal after amplitude adjustment. The arcsine correction improves the linearity of the demodulated signal.

DETAILED DESCRIPTION OF THE INVENTION

Embodiments of the invention will be described with reference to the attached drawings, following a more detailed description of a conventional FM radio broadcast receiver that employs digital signal processing. Like parts in different drawings will be indicated by like reference characters.

Figure 1:
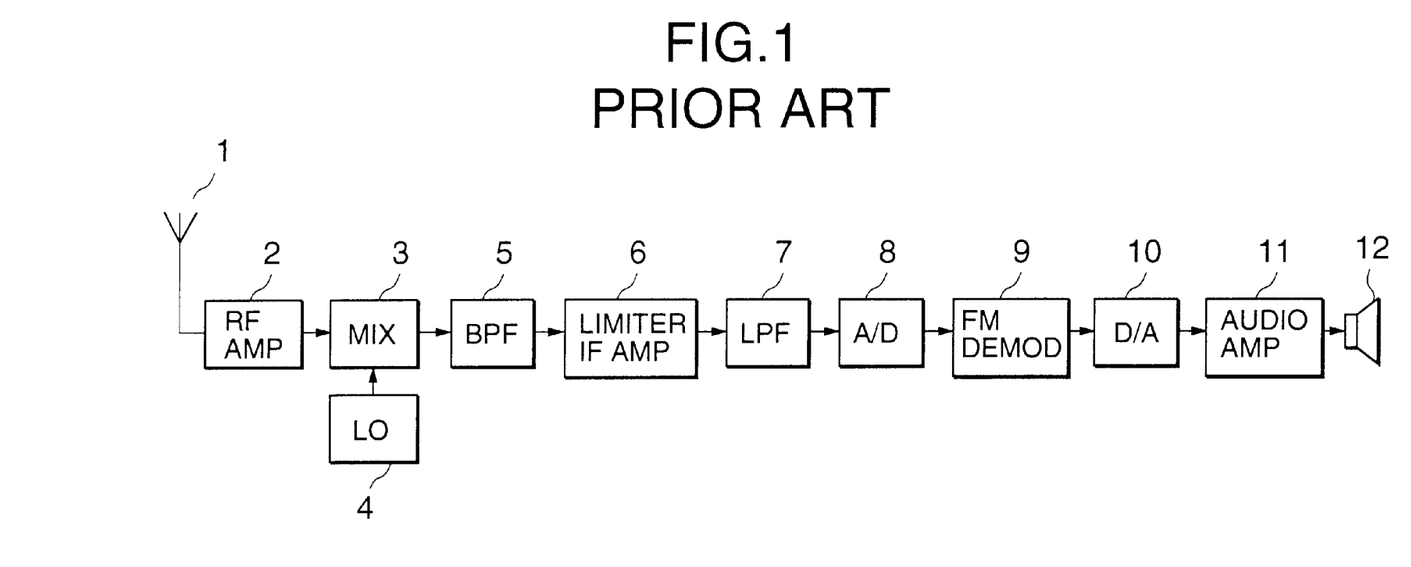
FIG. 1 is a block diagram of a conventional FM radio broadcast receiver incorporating a digital FM demodulator.

FIG. 1 is a block diagram of a conventional FM radio broadcast receiver having a digital FM demodulator. The receiver includes an antenna 1, an RF amplifier (AMP) 2, a mixer (MIX) 3, a local oscillator (LO) 4, a bandpass filter (BPF) used as an intermediate-frequency (IF) filter 5, an intermediate-frequency limiter amplifier 6, a low-pass filter (LPF) used as a pre-filter 7, an analog-to-digital (A/D)

converter 8, a digital FM demodulator (DEMOD) 9, a digital-to-analog (D/A) converter 10, an audio amplifier 11, and a loudspeaker 12.

The signal received at the antenna 1 is amplified by the RF amplifier 2 and down-converted by the local oscillator 4 and mixer 3. The intermediate-frequency bandpass filter 5 removes unwanted signal components such as adjacent-channel components, after which the intermediate-frequency limiter amplifier 6 limits the signal amplitude, and the pre-filter 7 rejects harmonics of the intermediate carrier frequency. The A/D converter 8 converts the resulting signal to a digital FM signal, which is demodulated to a digital audio signal by the digital FM demodulator 9. The D/A converter 10 converts the digital audio signal to an analog audio signal, which is amplified by the audio amplifier 11 and reproduced through the loudspeaker 12.

Figure 2:
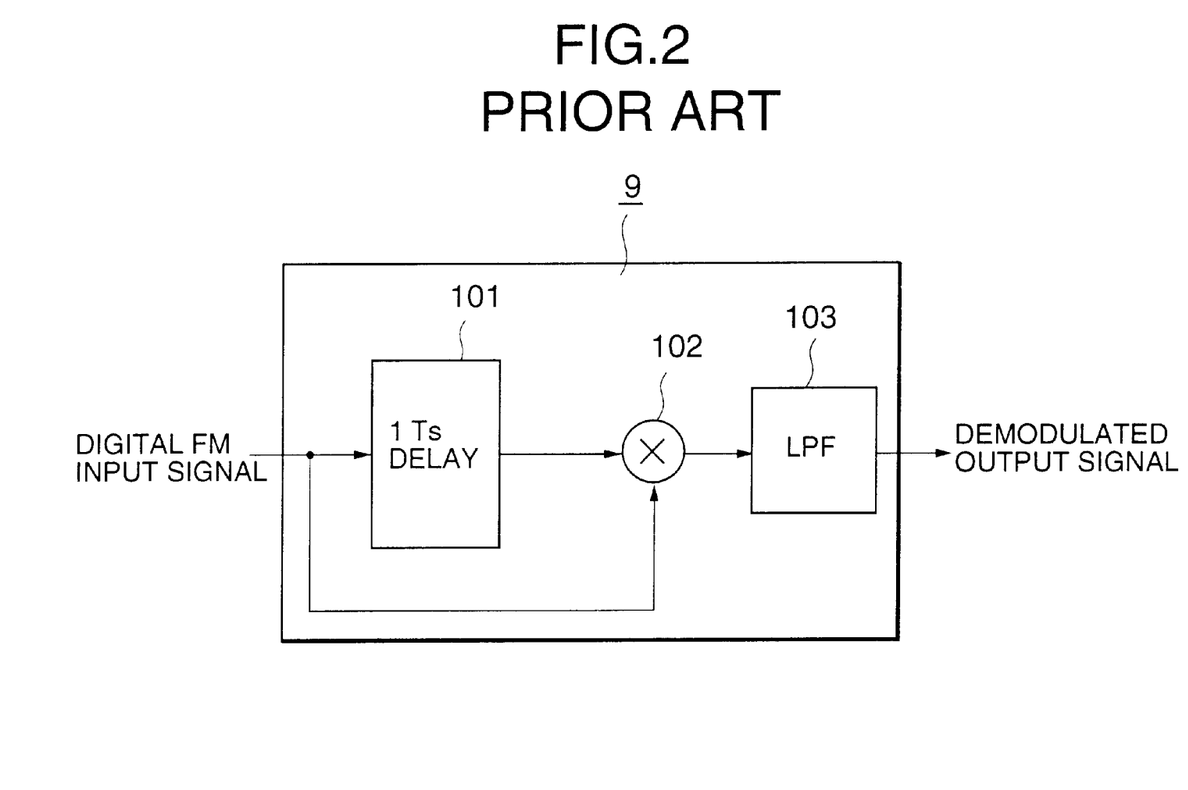
FIG. 2 is a block diagram of the digital FM demodulator in FIG. 1.

Referring to FIG. 2, the digital FM demodulator 9 comprises a delay unit 101, a multiplier 102, and a low-pass filter 103. The delay unit 101 delays the digital FM input signal by one sampling period (Ts). The multiplier 102 multiplies the resulting delayed signal by the undelayed digital FM input signal. The low-pass filter 103 performs a digital low-pass filtering operation on the output of the multiplier 102 to obtain the demodulated digital audio output signal.

The operation of the digital FM demodulator 9 can be analyzed mathematically as follows. The digital FM input signal $x_0$ received by the digital FM demodulator 9 is expressed by the following equation (1), in which AC is the intermediate carrier amplitude, $f_c$ is the intermediate carrier frequency, p(kT) is the phase shift due to modulation of the signal, and T is equal to $1/(4f_c)$, so that $2\pi f_c T = \pi/2$.

$$x_0 = A_c \cos\{2\pi f_c kT + p(kT)\} \quad (1)$$

The delay unit 101 provides a delay of T, generating the delayed signal $x_1$ given by the following equation (2).

$$x_1 = A_c \cos\{2\pi f_c(k-1)T + p((k-1)T)\} \quad (2)$$

Since the delay T is equivalent to a phase angle of $\pi/2$ (90°) at the intermediate carrier frequency, the delayed signal $x_1$ can be expressed as in the following equation (3).

$$x_1 = A_c \cos\{2\pi f_c kT + p((k-1)T) - \pi/2\} \quad (3)$$
$$= A_c \sin\{2\pi f_c kT + p((k-1)T)\}$$

The following equation (4) shows the result of multiplication of $x_0$ as given in equation (1) by $x_1$ as given in equation (3) That is, equation (4) expresses the output of the multiplier 102.

$$x_0 \cdot x_1 = A_c^2 \sin\{4\pi f_c kT + p(kT) + p((k-1)T)\}/2 + A_c^2 \sin\{p(kT) - p((k-1)T)\}/2 \quad (4)$$

The first term in equation (4) has a frequency equal to twice the carrier frequency, and is rejected by the low-pass filter 103. Only the second term in equation (4) is output from the digital FM demodulator 9. This term is proportional to the sine of the change in the phase shift p(kT) due to the delay T (that is, to $\{p(kT) - p((k-1)T)\}$). If T is sufficiently shorter than the period of the maximum frequency of the modulated signal, the phase shift is small, and an approximation ($y_0$) to the output of the digital FM demodulator 9 can be obtained by replacing the sine function with the derivative of the phase function p(t), as shown in equations (5) and (6) below.

$$y_0 \approx A_c^2 \sin\{p(kT) - p((k-1)T)\}/2 \quad (5)$$

$$y_0 = A_c^2 T\{dp(t)/dt\}/2 \quad (6)$$

For a frequency-modulated signal, the derivative with respect to time of the phase shift of the modulated signal is equal to the modulating signal, so the signal given by equation (6) is the demodulated signal.

The preceding discussion assumes that the signal input to the digital FM demodulator 9 is an ideal digital FM signal, substantially equal to a sine-wave signal with constant amplitude at the intermediate carrier frequency, with no higher harmonic components. If higher harmonics are present, the demodulated signal may be severely distorted.

Furthermore, if the amplitude ($A_c$) of the digital FM signal varies, the amplitude variations are transferred directly to the output signal of the digital FM demodulator 9, again distorting the demodulated signal.

Several embodiments of the invention will now be described. All of the embodiments are used in an FM radio broadcast receiver having the block structure shown in FIG. 3, comprising an antenna 1, an RF amplifier 2, a mixer 3, a local oscillator 4, an intermediate-frequency filter 5, an intermediate-frequency limiter amplifier 6, a pre-filter 7, an A/D converter 8, a digital FM demodulator 18, a D/A converter 10, an audio amplifier 11, and a loudspeaker 12. The overall structure of this receiver is the same as the structure of the conventional receiver shown in FIG. 1, but the internal structure of the digital FM demodulator 18 differs from the conventional structure shown in FIG. 2.

Figure 4:
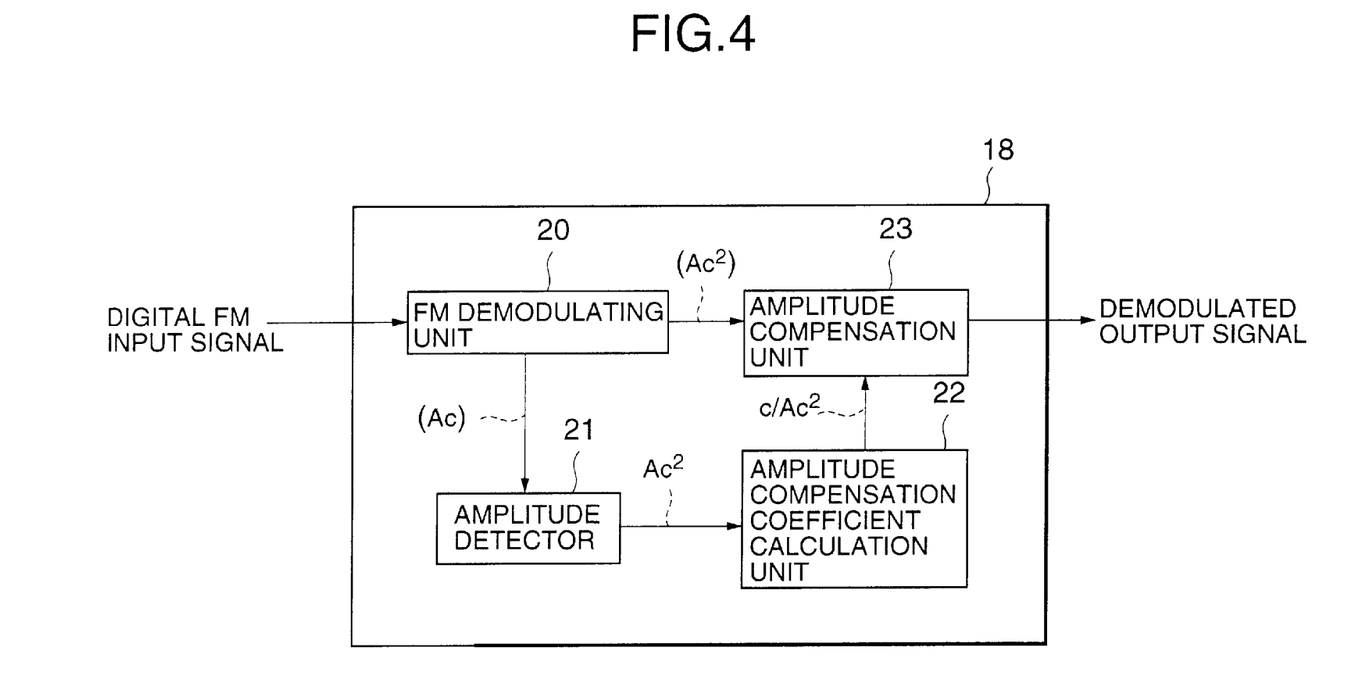
FIG. 4 is a block diagram illustrating a first embodiment of the invented digital FM demodulator.

Referring to FIG. 4, in a first embodiment of the invention, the digital FM demodulator 18 comprises an FM demodulating unit 20, an amplitude detector 21, an amplitude compensation coefficient calculation unit 22, and an amplitude compensation unit 23. Each of these blocks can be implemented as hardware, software, or a combination of hardware and software.

The FM demodulating unit 20 receives a sampled digital FM input signal from the A/D converter 8, demodulates the received signal, and supplies the demodulated signal to the amplitude compensation unit 23. The demodulated signal is described by equation (5) above, being substantially proportional to the modulating signal multiplied by the square ($A_c^2$) of the carrier amplitude of the digital FM input signal.

The amplitude detector 21 receives a signal having the same amplitude ($A_c$) as the digital FM input signal from the FM demodulating unit 20, detects this amplitude ($A_c$), and generates a corresponding amplitude signal. In the following description, the corresponding amplitude signal will be a signal indicating the square ($A_c^2$) of the amplitude of the digital FM input signal, averaged over a certain number of samples of the digital FM input signal.

The amplitude compensation coefficient calculation unit 22 receives the amplitude signal output from the amplitude detector 21, generates a coefficient signal proportional to the reciprocal of the amplitude signal, and supplies the coefficient signal to the amplitude compensation unit 23. The coefficient signal will be denoted $c/A_c^2$, where c is a constant.

The amplitude compensation unit 23 multiplies the demodulated signal received from the FM demodulating unit 20 by the coefficient signal ($c/A_c^2$) received from the amplitude compensation coefficient calculation unit 22. The resulting product is the demodulated audio signal output by the digital FM demodulator 18.

The effect of the amplitude compensation unit 23 is to replace the possibly variable quantity $A_c^2$ in equation (5) above with a constant quantity (c). Accordingly, even if the amplitude ($A_c$) of the digital FM input signal varies, distorting the demodulated signal output by the FM demodulating unit 20, the amplitude compensation unit 23 removes the distortion from the demodulated digital audio signal output by the digital FM demodulator 18.

Figure 3:
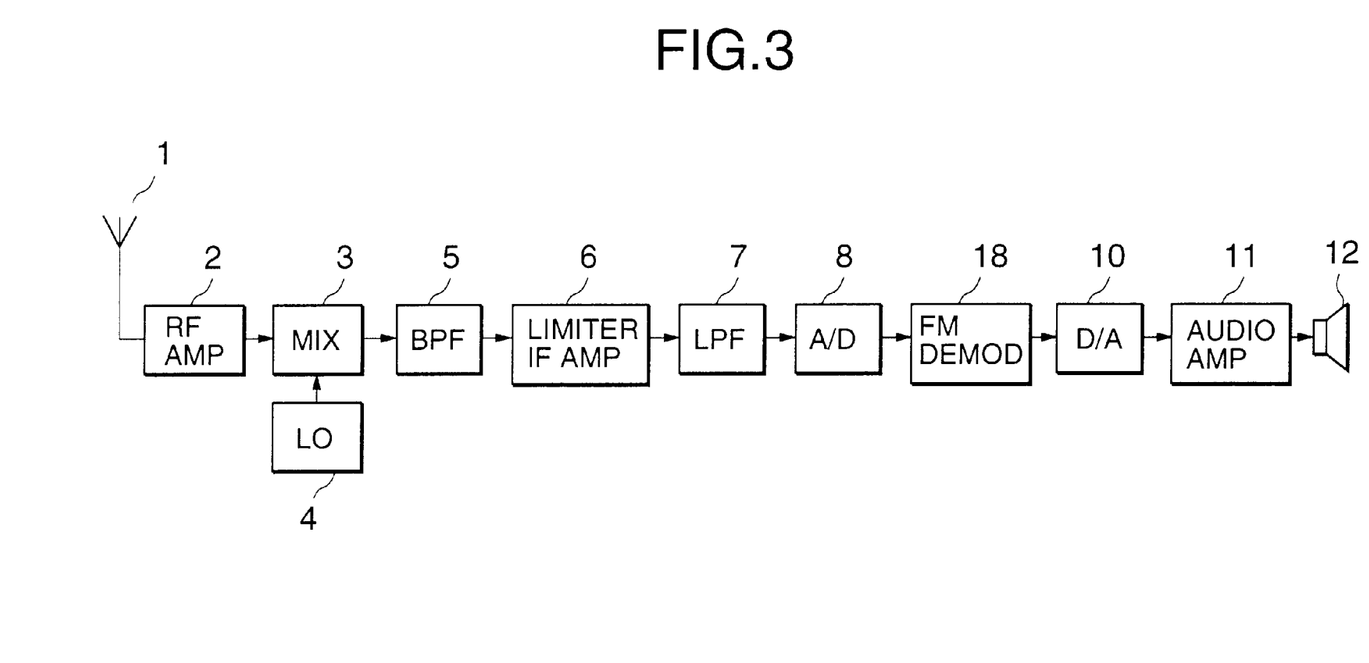
FIG. 3 is a block diagram of an FM radio broadcast receiver incorporating the invented digital FM demodulator.

Taken together, the amplitude compensation coefficient calculation unit 22 and the amplitude compensation unit 23 form an amplitude adjustment means that compensates for amplitude variations in the digital FM input signal, such as variations introduced by the pre-filter 7 in FIG. 3. Consequently, the pre-filter 7 does not have to satisfy as stringent performance requirements as in a conventional receiver. Satisfactory performance can be obtained from a pre-filter 7 implemented in a semiconductor integrated circuit, enabling the receiver in FIG. 3 to be more compact and less expensive than the conventional receiver.

The amplitude compensation coefficient calculation unit 22 and the amplitude compensation unit 23 also compensate for amplitude variations introduced by the A/D converter 8, so that the A/D converter does not need to have a perfectly flat gain characteristic.

The amplitude detector 21 is not limited to taking an average value of the square of the digital FM input signal. As an alternative, the amplitude detector can calculate an average absolute value of the digital FM input signal. In any case, the averaging process must be carried out so as not to lose the information needed to remove distortion from the demodulated signal. That is, the averaging process must not hide amplitude variations in the range up to highest frequency at which distortion is to be removed from the demodulated signal. In FM audio broadcasts, this frequency is at most fifty-three kilohertz (53 kHz), which is the highest frequency of the upper sideband of the left-right difference component of an FM composite signal. The requirement that the averaging process not lose necessary information can be satisfied if the carrier frequency of the FM signal and the sampling frequency of the digital FM signal are sufficiently high, in comparison with the highest frequency of the at which amplitude distortion is to be removed.

Figure 5:
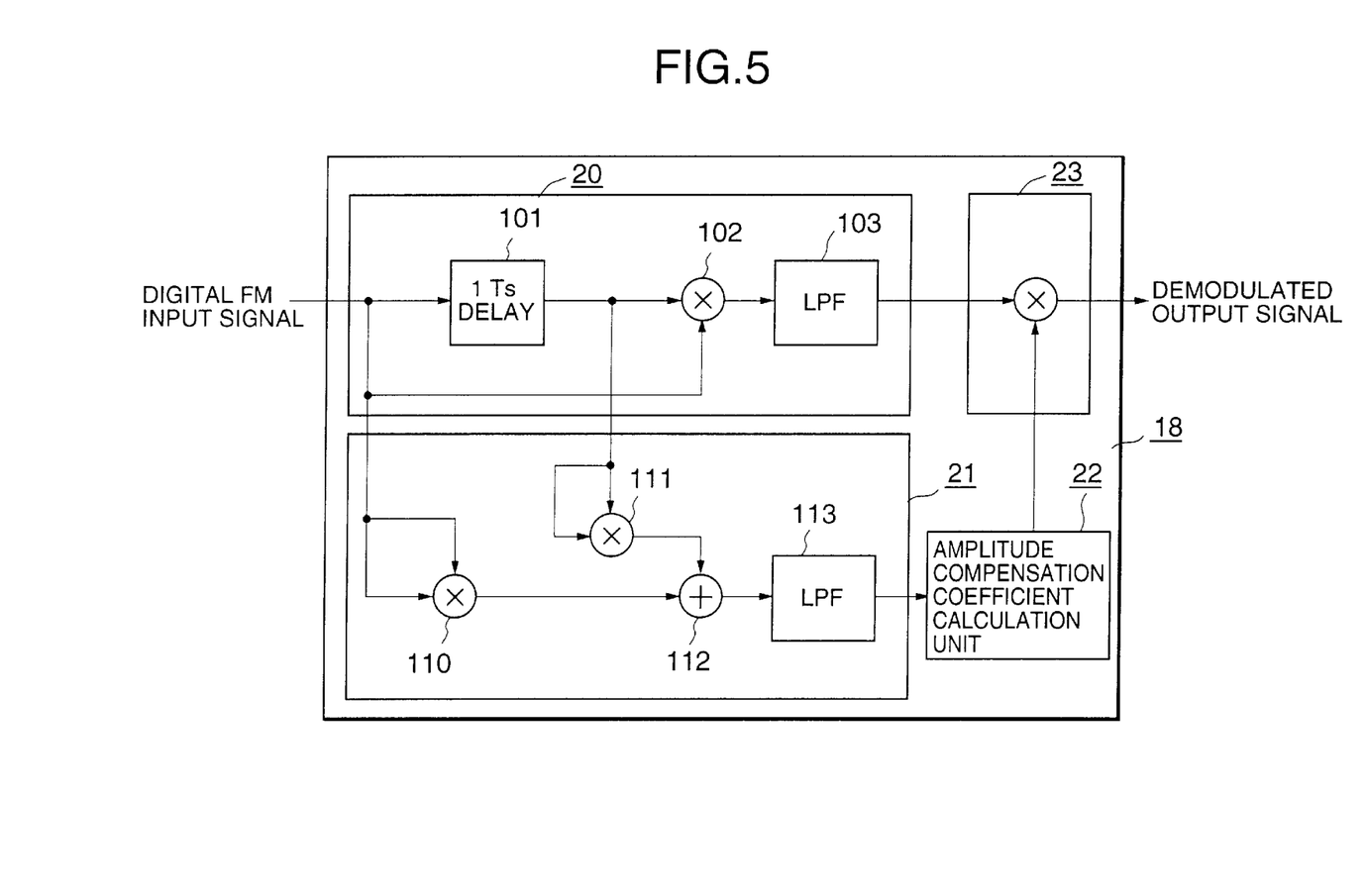
FIG. 5 is a block diagram illustrating a second embodiment of the invented digital FM demodulator.

As a second embodiment of the invention, FIG. 5 shows a digital FM demodulator 18 in which the FM demodulating unit 20 has the conventional structure, comprising a delay unit 101, multiplier 102, and low-pass filter 103, and the amplitude detector 21 comprises a pair of multipliers 110, 111, an adder 112, and a low-pass filter 113. The amplitude compensation coefficient calculation unit 22 and amplitude compensation unit 23 operate as in the first embodiment, the amplitude compensation unit 23 multiplying the output of the FM demodulating unit 20 by the coefficient calculated by the amplitude compensation coefficient calculation unit 22.

In the amplitude detector 21, multiplier 110 multiplies the digital FM input signal by itself, obtaining the square thereof. Multiplier 111 multiplies the delayed signal output by the delay unit 101 by itself, obtaining the square thereof. Adder 112 adds these two squares, and the low-pass filter 113 operates on the resulting sum.

The digital FM input signal $x_0$ received by multiplier 110 and the delayed signal $x_1$ received by multiplier 111 are given by equations (1) and (2) above. The sum of their squares is accordingly given by equation (7) below, in which pp is written in place of $p((k-1)T)$, and $\delta p$ in place of $p((k-1)T)-p(kT)$. The delay T generated in the delay unit 101 (expressed as the sampling period Ts in FIG. 5) is the minimum time unit in the quantity $\delta p$. That is the delay unit 101 generates the smallest possible delay. If the phase shift $\delta p$ occurring in this minimum time unit T is sufficiently small, as is normally the case in a digital FM receiver, then equation (7) can be simplified to the form given in equation (8).

$$\begin{aligned}x_0^2 + x_1^2 &= [A_c\cos\{2\pi f_c kT + p(kT)\}]^2 + \\ &\quad [A_c\sin\{2\pi f_c kT + p((k-1)T)\}]^2 \\ &= [A_c\cos\{2\pi f_c kT + p((k-1)T + \delta p\}]^2 + \\ &\quad [A_c\sin\{2\pi f_c kT + p((k-1)T)\}]^2 \\ &= [A_c\cos\{2\pi f_c + pp + \delta p\}]^2 + [A_c\sin\{2\pi f_c kT + pp\}]^2 \\ &= A_c^2[\cos\{2\pi f_c kT + pp\}\cos(\delta p) - \\ &\quad \sin\{2\pi f_c kT + pp\}\sin(\delta p)]^2 + \\ &\quad [A_c\sin\{2\pi f_c kT + pp\}]^2 \\ &= A_c^2[\cos^2\{2\pi f_c kT + pp\}\cos^2(\delta p) + \\ &\quad \sin^2\{2\pi f_c kT + pp\}\sin^2(\delta p) - \\ &\quad 2\cos\{2\pi f_c kT + pp\}\cos(\delta p)\sin\{2\pi f_c kT + pp\}\sin(\delta p) + \\ &\quad \sin^2\{2\pi f_c kT + pp\}]\end{aligned} \quad (7)$$

$$x_0^2+x_1^2 \approx A_c^2(1-2\cos\{2\pi f_c kT+pp\}\cos(\delta p)\sin\{2\pi f_c kT+pp\}\sin(\delta p)) \quad (8)$$

The above equation (8) indicates that the sum output by adder 112 is substantially the square of the amplitude of the FM signal, to within the error given by the second term inside the parentheses. Moreover, the errors in successive sums output by adder 112 will tend to cancel out over time, and can be removed by a comparatively simple low-pass filter 113, such as a filter that simply takes an average value. When the changes in the values of $\delta p$ and pp are small, that is, the absolute value of the error term remains substantially constant, and the phase of $\{2\pi f_c kT+pp\}$ changes in steps of substantially $\pi/2$, causing the sign of the error term to reverse. Accordingly, the low-pass filter 113 in the second embodiment can readily be designed to generate a signal indicating the square of the amplitude of the digital FM input signal with sufficient accuracy to substantially eliminate amplitude distortion from the digital audio output signal.

Figure 6:
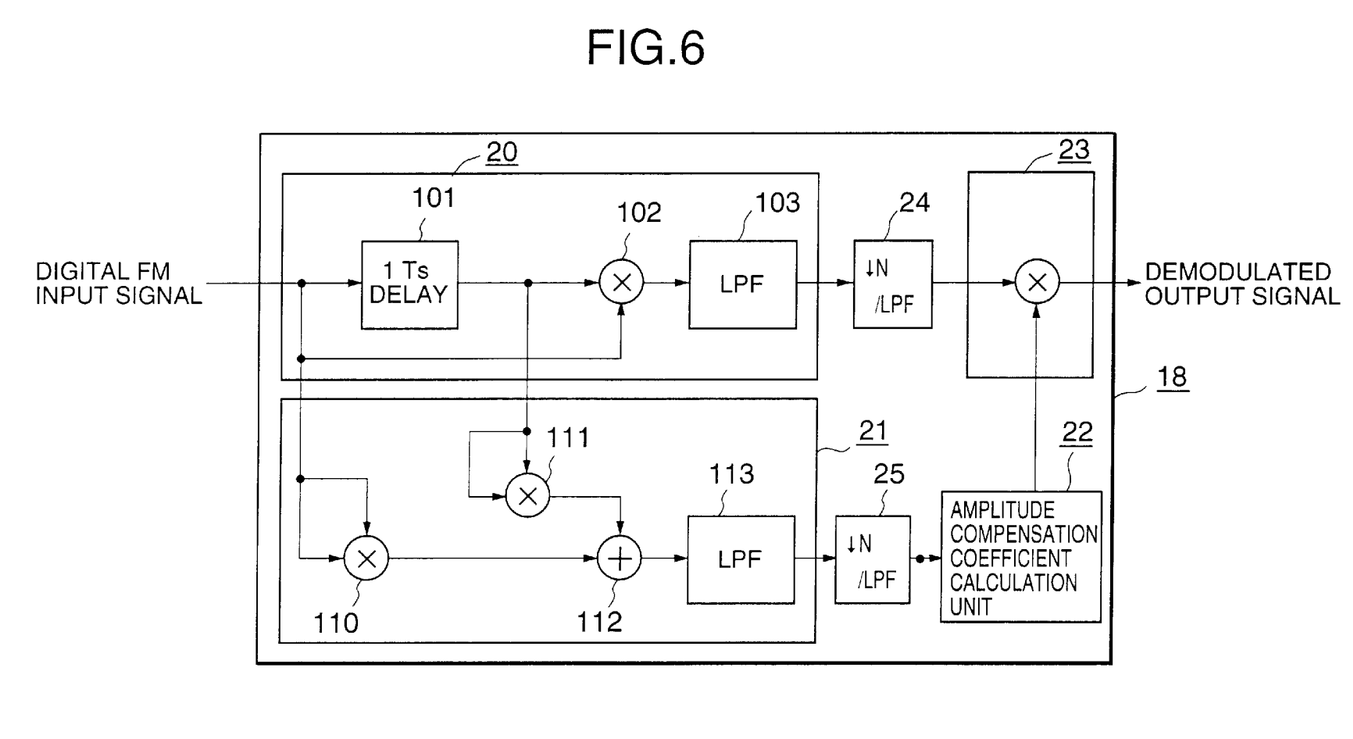
FIG. 6 is a block diagram illustrating a third embodiment of the invented digital FM demodulator.

As a third embodiment of the invention, FIG. 6 shows a digital FM demodulator 18 that adds a pair of decimators 24, 25 to the digital FM demodulator shown in the second embodiment. Decimator 24 selects every Nth value output by the FM demodulating unit 20 for input to the amplitude compensation unit 23, thereby reducing the data rate by a factor of N, N being an integer greater than one. Decimator 25 similarly selects every Nth value output by the amplitude detector 21 for input to the amplitude compensation coefficient calculation unit 22.

The third embodiment is useful when the sampling frequency of the A/D converter 8 is several times higher than twice the maximum frequency $f_{mh}$ of the FM signal. A well-known sampling theorem states that the sampling frequency can be reduced by decimation to $2f_{mh}$ without loss of the information included in the FM signal. By reducing the rate at which data are supplied to the amplitude compensation coefficient calculation unit 22 and amplitude compensation unit 23, and thus to the D/A converter 10 in FIG. 3, the third embodiment reduces the data-processing requirements in the FM radio receiver, thereby reducing the cost of the receiver.

The decimators 24, 25 also operate as low-pass filters, passing only frequency components up to one-half the output sampling frequency of the digital FM demodulator 18 (the output sampling frequency is equal to the input sampling frequency of the digital FM demodulator 18 divided by N). Accordingly, the low-pass filters 103, 113 in the FM demodulating unit 20 and amplitude detector 21 need only pass frequency components up to this frequency.

If there is a processing delay between the decimated signals output by the decimators 24, 25, further delay means may be inserted to compensate for this delay.

Table 1 shows the results of computer simulations of the operation of the third embodiment. The center frequency of the intermediate-frequency FM signal in these simulations was 608 kHz. The modulating signal was a 1-kHz sine wave. The intermediate-frequency FM signal was filtered by a fifth-order Butterworth filter to remove unwanted harmonics.

The sampling frequency was 4.864 MHz, or eight times the intermediate frequency. The data sampled at this frequency were decimated by a factor of two in a low-pass filter before input to the digital FM demodulator. The purpose of the simulation was to see the effect of the filter characteristics on the fundamental wave of the FM signal (the signal before input to the intermediate-frequency limiter amplifier 6), and observe the effect of amplitude compensation in the digital FM demodulator.

TABLE 1

Distortion with 5th-order Butterworth Filter

| Signal | Compensation | $f_d$ 1 MHz | 800 kHz | 708 kHz |
|---|---|---|---|---|
| Mono 30% modulation | No | −55.8 dB | −37.6 dB | −25.6 dB |
|  | Yes | −65.9 dB | −65.2 dB | −65.1 dB |
| L 30% modulation | No | −58.5 dB | −37.3 dB | −26.3 dB |
|  | Yes | −61.4 dB | −58.1 dB | −57.6 dB |

The results of this simulation show that as the cut-off frequency $f_d$ of the fifth-order Butterworth filter is reduced from one megahertz (1 MHz) to 800 kHz, then to 708 kHz, without amplitude compensation, the distortion of a monaural signal with a 30% modulation index increases from −55.8 decibels (dB) to −25.6 dB, and the distortion of a stereo signal with a 30% modulation index increases from −58.5 dB to −26.3 dB. Distortion of the stereo signal was measured in the left (L) channel. In contrast to these pronounced increases, when amplitude compensation is employed, the distortion increases only slightly: to −65.1 dB in the monaural signal, and to −57.8 dB in the stereo signal.

These results suggest that the principal cause of the increased distortion as the cut-off frequency of the fifth-order low-pass Butterworth filter is lowered is the amplitude variations added to the FM signal by the passband characteristics of the filter, because the distortion is largely eliminated when amplitude compensation is applied.

With an intermediate frequency of 608 kHz, the slope of the frequency characteristic of the fifth-order low-pass Butterworth filter increases from approximately 0.00016 dB/kHz when the cut-off frequency is 1 MHz to 0.0017 dB/kHz at 800 kHz, and to 0.0075 dB/kHz at 708 kHz. The above simulation indicates that with a conventional digital FM demodulator, even these slight changes in the filter characteristic can have a major effect on distortion.

It would be extremely difficult to suppress these small changes in filter characteristics in a filter implemented in an analog integrated circuit. The present invention overcomes this difficulty by enabling the digital FM demodulator to tolerate the effects of imperfect low-pass filtering. Thus, the present invention can be an important factor in enabling the use of semiconductor integrated circuits in an FM radio receiver with low audio output distortion.

Figure 7:
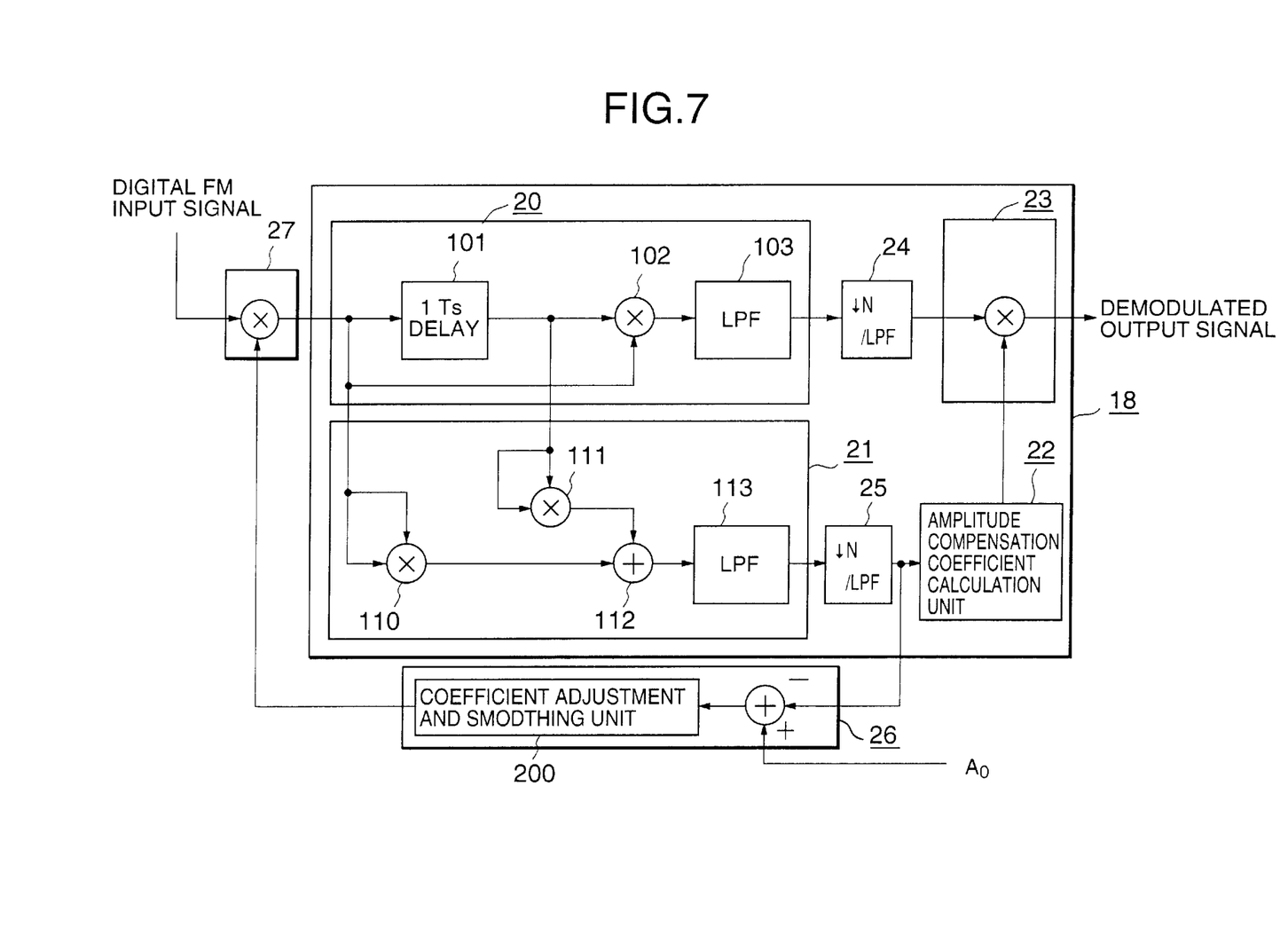
FIG. 7 is a block diagram illustrating a fourth embodiment of the invented digital FM demodulator.

As a fourth embodiment of the invention, FIG. 7 shows a digital FM demodulator 18 with the structure of the third embodiment, to which a second coefficient calculation unit 26 and an amplitude pre-compensation unit 27 are added. The second coefficient calculation unit 26 calculates a pre-compensation coefficient from a preset target value ($A_0$) and the output of decimator 25. The amplitude pre-compensation unit 27 multiplies the digital FM signal by the calculated pre-compensation coefficient before input of this signal to the digital FM demodulator 18.

The second coefficient calculation unit 26 calculates the pre-compensation coefficient from the difference between the target value ($A_0$) and the amplitude value output from decimator 25, which represents the square of the amplitude of the digital FM signal as described above. The difference is obtained by a subtractor in the second coefficient calculation unit 26, shown as an adder with positive and negative inputs. The pre-compensation coefficient is calculated so as to reduce the difference. The calculations are performed by a coefficient adjustment and smoothing unit 200, which also performs smoothing operations, so that the pre-compensation coefficient value does not change abruptly.

The circuits in the digital FM demodulator 18 operate as described in the preceding embodiments. In the fourth embodiment, however, the amplitude compensation coefficient calculation unit 22 uses a polynomial approximation to the reciprocal of the amplitude signal $A_c^2$ to calculate the value $c/A_c^2$.

Polynomial approximation methods are well known. They have the advantage of requiring only multiplication and addition operations, which can be carried out much faster than the long division required in a direct reciprocal calculation. They also have the disadvantage that satisfactory accuracy is obtained only for a limited range of values.

An example of the type of polynomial approximation that can be used in the present embodiment is the following:

$$1/x \approx 3.07311 - 3.11606x + 1.04275x^2$$

Figure 8:
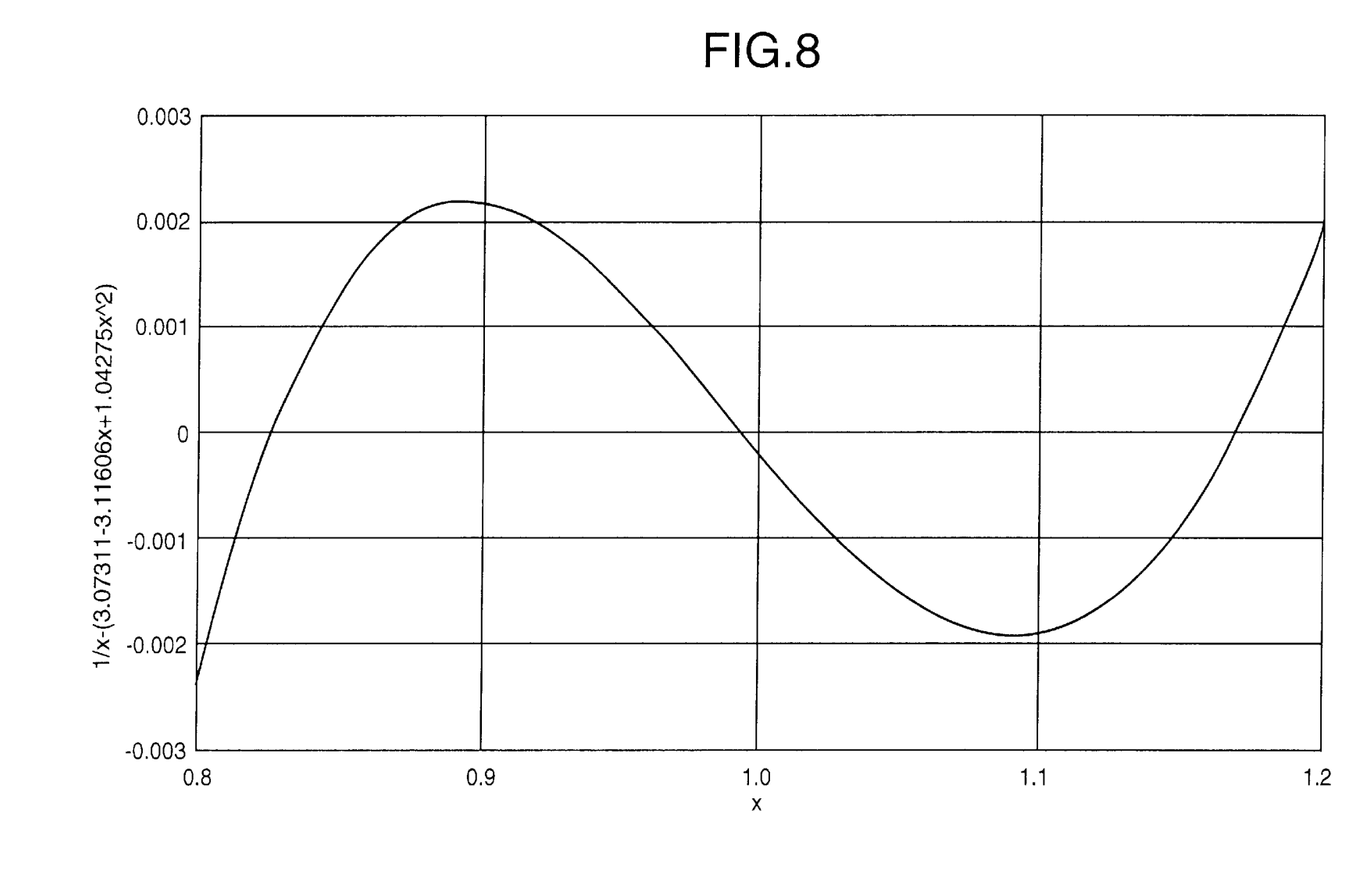
FIG. 8 is a graph illustrating the error of a polynomial approximation employed in the fourth embodiment.

FIG. 8 illustrates the error of this approximation for values of x from 0.8 to 1.2. Within this range, the error is almost always less than 0.002. Outside this range, the error increases. If necessary, the usable range of the approximation can be expanded, and the error reduced, by adding higher-order terms to the above polynomial expression.

In the fourth embodiment, although the amplitude of the digital FM signal may vary due to variations in the limit level of the intermediate-frequency limiter amplifier 6, and variations in the gain of the pre-filter 7 and A/D converter 8, most of these variations are eliminated by the second coefficient calculation unit 26 and amplitude pre-compensation unit 27. The (squared) amplitude value $A_c^2$ received by the amplitude compensation coefficient calculation unit 22 is nearly steady, varying only in a small range around the target value $A_0$. If the target value is placed at the center of the effective polynomial approximation range, the amplitude compensation coefficient calculation unit 22 can obtain an accurate approximation to the reciprocal of $A_c^2$ by using a polynomial of comparatively small degree, enabling the polynomial approximation to be calculated $c/A_c^2$ with comparatively little computation. The amplitude compensation coefficient calculation unit 22 can accordingly have a comparatively simple processing structure.

The effective approximation range of the amplitude compensation coefficient calculation unit 22 is preferably large enough to include the small, random fluctuations that almost always occur in the average amplitude of the FM signal, so that the amplitude pre-compensation unit 27 does not have to remove these fluctuations. The second coefficient calculation unit 26 can then update the coefficient value supplied to the amplitude pre-compensation unit 27 at a relative slow rate, whereby the amount of computation necessary in the second coefficient calculation unit 26 can be reduced.

Figure 9:
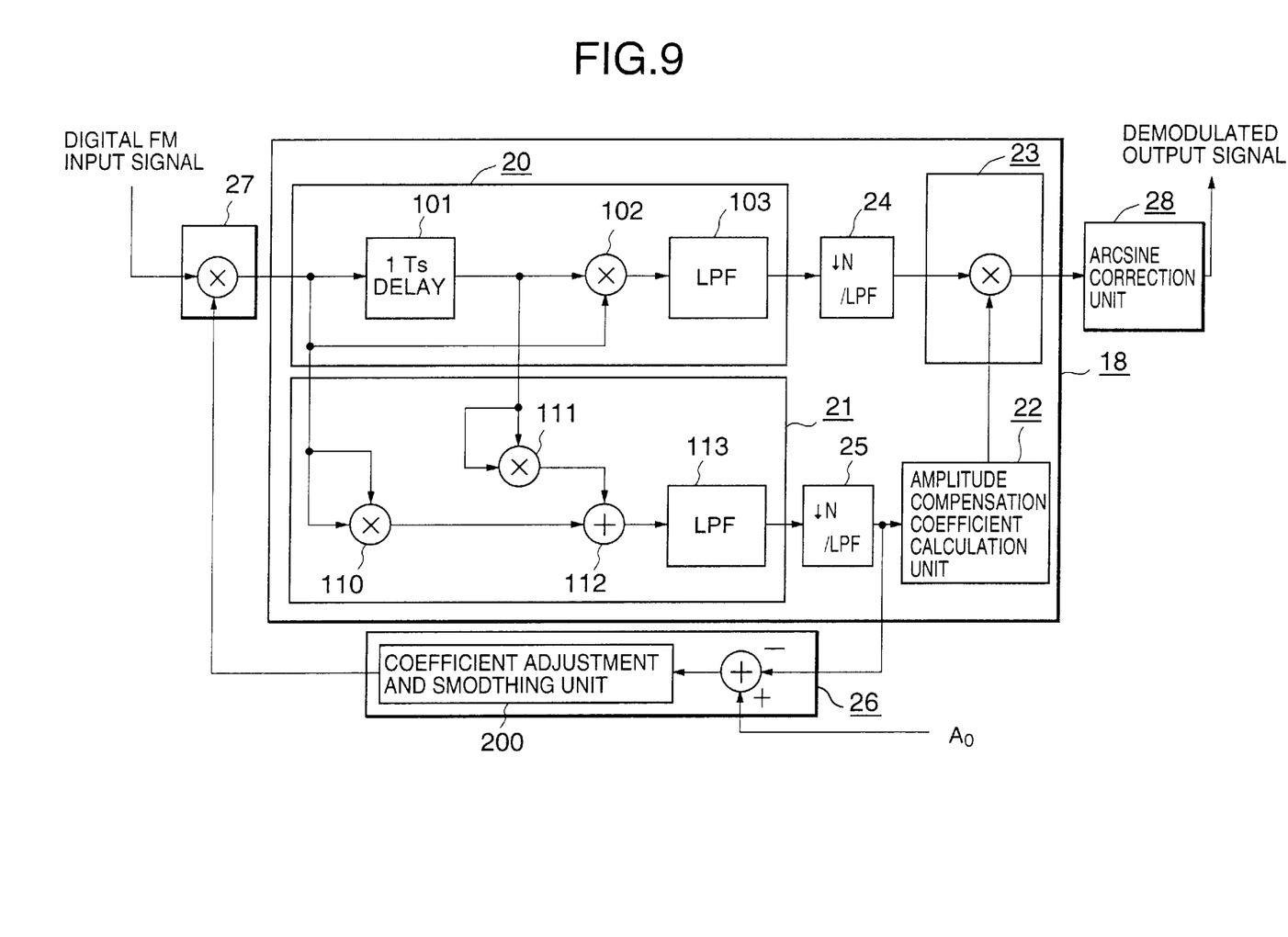
FIG. 9 is a block diagram illustrating a fifth embodiment of the invented digital FM demodulator.

As a fifth embodiment of the invention, FIG. 9 shows an arcsine correction unit 28 added to the digital FM demodulator 18, second coefficient calculation unit 26, and amplitude pre-compensation unit 27 of the fourth embodiment. The arcsine correction unit 28 applies an arcsine function to the demodulated digital audio signal output from the digital FM demodulator 18. The digital FM demodulator 18, second coefficient calculation unit 26, and amplitude pre-compensation unit 27 operate as described in the preceding embodiments.

The arcsine function applied by the RF amplifier 2 compensates for the tendency of the linearity of the digital FM demodulator 18 to decrease with increasing deviation of the modulated carrier signal from its center frequency. The reason for this tendency is the occurrence of the sine function in equation (5). By applying an arcsine function, which is inverse to the sine function, the arcsine correction unit 28 restores linearity.

The arcsine correction unit 28 uses a polynomial approximation to the arcsine function. An example of an approximation that can be used is the following fifth-degree polynomial.

$$\arcsin(x) \approx x + x^3/6 + 3x^5/40$$

In order for this approximation to be used, the value of x must be normalized to a value within the range of the sine function, which is from plus one to minus one. That is, the maximum amplitude $\pm A_c^2/2$ of the signal input the amplitude compensation unit 23 must be normalized to $\pm 1$. This can be done by suitable selection of the constant (c) used in the amplitude compensation coefficient calculation unit 22, and of the target value ($A_0$) supplied to the second coefficient calculation unit 26. Accurate normalization is possible because the signal amplitude is adjusted by the amplitude pre-compensation unit 27 before the signal reaches the amplitude compensation unit 23.

By converting the sine function in equation (5) to a substantially linear function, the fifth embodiment further reduces distortion in the demodulated digital audio signal.

If the amplitude variation of the digital FM signal input to the digital FM demodulator 18 in the first three embodiments is sufficiently small, the arcsine correction unit 28 can be added to those embodiments without the need for a second coefficient calculation unit 26 and amplitude pre-compensation unit 27.

As described above, the present invention enables a digital FM demodulator to compensate for amplitude variations in a digital FM input signal, so that the amplitude variations do not distort the demodulated output signal. This capability reduces the performance requirements of components preceding the digital FM demodulator in an FM receiver, thereby enabling the use of semiconductor integrated circuits, so that the size and cost of the FM receiver can be reduced.

The invention is not limited to the embodiments described above; the features of these embodiments can be combined in various other ways. For example, the polynomial approximation to the reciprocal of the amplitude signal, used in the fourth embodiment, can also be used in the first three embodiments, if the variations in the amplitude of the digital FM input signal are sufficiently small.

Those skilled in the art will recognize that further variations are possible within the scope claimed below.

What is claimed is:

1. A digital FM demodulator, comprising:
   means for demodulating a digital FM input signal to obtain a demodulated signal;
   means for detecting an amplitude of the digital FM input signal and generating a corresponding amplitude signal;
   means for calculating an amplitude compensation coefficient; and
   means for performing amplitude compensation, said means for performing amplitude compensation operating in combination with said means for calculating an amplitude compensation coefficient to adjust an amplitude of the demodulated signal according to the amplitude signal, thereby compensating for variations in the amplitude of the digital FM input signal,
   wherein said means for demodulating delays the digital FM input signal to obtain a delayed signal, and multiplies the digital FM input signal by the delayed signal, and
   wherein said means for detecting calculates a sum of squares of the digital FM input signal and the delayed signal.

2. The digital FM demodulator of claim 1, wherein said means for adjusting calculates a polynomial approximation to a reciprocal of the amplitude signal, and multiplies said demodulated signal by said polynomial approximation.

3. The digital FM demodulator of claim 1, further comprising:
   first decimating means for decimating the demodulated signal before input of the demodulated signal to said means for adjusting; and
   second decimating means for decimating the amplitude signal before input of the amplitude signal to said means for adjusting.

4. The digital FM demodulator of claim 1, further comprising:
   means for calculating a pre-compensation coefficient from the amplitude signal and a preset target value; and
   means for multiplying the digital FM input signal by the pre-compensation coefficient, thereby reducing the variations in the amplitude of the digital FM input signal.

5. The digital FM demodulator of claim 1, further comprising:
   means for applying an arcsine function to the adjusted demodulated signal output from said means for adjusting, thereby reducing non-linearity of the adjusted demodulated signal.

6. An FM radio broadcast receiver comprising the digital FM demodulator of claim 1.

7. A method of demodulating a digital FM input signal, comprising the steps of:
   converting the digital FM input signal to a demodulated signal;
   detecting an amplitude of the digital FM input signal and generating a corresponding amplitude signal;
   calculating an amplitude compensation coefficient; and
   performing ampltiude compensation, said step of performing amplitude compensation operating in combination with said step of calculating an ampltiude compensation coefficient to adjust an amplitude of the demodulated signal according to the amplitude signal, thereby compensating for variations in the amplitude of the digital FM input signal, wherein said step of converting further comprises the steps of:
  delaying the digital FM input signal to obtain a delayed signal; and
  multiplying the digital FM input signal by the delayed signal, and
  wherein said step of detecting includes calculating a sum of squares of the digital FM input signal and the delayed signal.

8. The method of claim 7, wherein said step of adjusting further comprises the steps of:
  calculating a polynomial approximation to a reciprocal of the amplitude signal; and
  multiplying the demodulated signal by said polynomial approximation.

9. The method of claim 7, further comprising the steps of:
  decimating the demodulated signal before said step of adjusting; and
  decimating the amplitude signal before said step of adjusting.

10. The method of claim 7, further comprising the steps of:
  calculating a pre-compensation coefficient from the amplitude signal and a preset target value; and
  multiplying the digital FM input signal by said pre-compensation coefficient, thereby reducing the variations in the amplitude of the digital FM input signal.

11. The method of claim 7, further comprising the step of:
  applying an arcsine function to the adjusted demodulated signal after said step of adjusting, thereby reducing non-linearity of the adjusted demodulated signal.

12. A digital FM demodulator, comprising:
  a demodulating unit that demodulates a digital FM input signal to obtain a demodulated signal;
  an amplitude detector that detects an amplitude of the digital FM input signal and generates a corresponding amplitude signal; and
  an amplitude compensation unit and an amplitude compensation coefficient calculation unit, which in combination adjusts an amplitude of the demodulated signal according to the amplitude signal, thereby compensating for variations in the amplitude of the digital FM input signal,
  wherein said demodulating unit delays the digital FM input signal to obtain a delayed signal, and multiplies the digital FM input signal by the delayed signal, and
  wherein said amplitude detector calculates a sum of squares of the digital FM input signal and the delayed signal.

13. The digital FM demodulator of claim 12, wherein said amplitude compensation coefficient calculation unit calculates a polynomial approximation to a reciprocal of the amplitude signal, and said amplitude compensation unit multiplies said demodulated signal by said polynomial approximation.

14. The digital FM demodulator of claim 12, further comprising:
  a first decimator that decimates the demodulated signal before input of the demodulated signal to said amplitude compensation unit; and
  a second decimator that decimates the amplitude signal before input of the amplitude signal to said amplitude compensation coefficient calculation unit.

15. The digital FM demodulator of claim 12, further comprising:
  a second coefficient calculation unit that calculates a pre-compensation coefficient from the amplitude signal and a preset target value; and
  a pre-compensation unit for multiplying the digital FM input signal by the pre-compensation coefficient, thereby reducing the variations in the amplitude of the digital FM input signal.

16. The digital FM demodulator of claim 12, further comprising:
  an arcsine correction unit that applies an arcsine function to the adjusted demodulated signal output from said amplitude compensation unit, thereby reducing non-linearity of the adjusted demodulated signal.

17. An FM radio broadcast receiver comprising the digital FM demodulator of claim 12.

* * * * *